United States Patent
Ohshima et al.

(10) Patent No.: US 9,018,925 B2
(45) Date of Patent: Apr. 28, 2015

(54) LOAD CONTROL APPARATUS

(75) Inventors: Shunzou Ohshima, Kosai (JP); Hiroko Aono, Kosai (JP)

(73) Assignee: Yazaki Corporation, Tokyo (JP)

( * ) Notice: Subject to any disclaimer, the term of this patent is extended or adjusted under 35 U.S.C. 154(b) by 352 days.

(21) Appl. No.: 13/393,087

(22) PCT Filed: Aug. 3, 2011

(86) PCT No.: PCT/JP2011/067768
§ 371 (c)(1),
(2), (4) Date: Feb. 28, 2012

(87) PCT Pub. No.: WO2012/018044
PCT Pub. Date: Feb. 9, 2012

(65) Prior Publication Data
US 2012/0153914 A1 Jun. 21, 2012

(30) Foreign Application Priority Data
Aug. 5, 2010 (JP) ................................. 2010-176268

(51) Int. Cl.
G05F 1/00 (2006.01)
H03K 17/082 (2006.01)
(Continued)

(52) U.S. Cl.
CPC .......... *H03K 17/0822* (2013.01); *H03K 17/163* (2013.01); *H03K 17/74* (2013.01)

(58) Field of Classification Search
USPC ......... 323/282, 284, 285, 299, 229–231, 234, 323/265, 351; 361/18, 87, 93.1, 93.9
See application file for complete search history.

(56) References Cited

U.S. PATENT DOCUMENTS

| | | | |
|---|---|---|---|
| 4,720,668 A | * | 1/1988 | Lee et al. ...................... 323/271 |
| 5,305,191 A | * | 4/1994 | Loftus, Jr. ...................... 363/17 |
| 5,920,224 A | | 7/1999 | Preslar |

(Continued)

FOREIGN PATENT DOCUMENTS

| | | |
|---|---|---|
| CN | 1921287 A | 2/2007 |
| DE | 10046668 A1 | 3/2001 |

(Continued)

OTHER PUBLICATIONS

Extended European Search Report, dated Feb. 13, 2013, issued by the European Patent Office in counterpart European Patent Application No. 11814669.5.

(Continued)

*Primary Examiner* — Matthew Nguyen
*Assistant Examiner* — Afework Demisse
(74) *Attorney, Agent, or Firm* — Sughrue Mion, PLLC

(57) ABSTRACT

A load control apparatus is provided in which a circuit of detecting an overcurrent can be correctly operated even if a first capacitor (C1) for noise measures is disposed. Since a second capacitor (C2) is provided between a gate and a drain of an FET (T1), when the voltage (V1) of a point (P1) decreases, a part of the gate current of the FET (T1) bypasses the FET (T1) and flows to the capacitor (C2), and the amount of charge supplied to the gate of the FET (T1) decreases. Therefore, the increase of the drain current of the FET (T1) can be suppressed and a sudden change of the voltage (V1) can be prevented. As a result, the voltage (V1) can be prevented from decreasing to such a degree that the comparator (CMP1) cannot operate, and the comparator (CMP1) can be prevented from malfunctioning.

5 Claims, 5 Drawing Sheets

(51) Int. Cl.
*H03K 17/16* (2006.01)
*H03K 17/74* (2006.01)

(56) References Cited

U.S. PATENT DOCUMENTS

| | | | |
|---|---|---|---|
| 6,222,709 | B1 * | 4/2001 | Baba .................. 361/18 |
| 6,313,617 | B1 | 11/2001 | Engelmann et al. |
| 6,441,679 | B1 | 8/2002 | Ohshima |
| 7,791,853 | B2 * | 9/2010 | Ohshima ............ 361/93.1 |
| 8,089,742 | B2 * | 1/2012 | Ohshima ............ 361/93.8 |
| 2007/0195563 | A1 | 8/2007 | Shiraishi et al. |
| 2010/0118461 | A1 | 5/2010 | Ohshima |
| 2010/0253306 | A1 | 10/2010 | Shiraishi et al. |
| 2012/0001609 | A1 | 1/2012 | Shiraishi et al. |

FOREIGN PATENT DOCUMENTS

| | | |
|---|---|---|
| EP | 1126610 A2 | 7/2000 |
| EP | 2139115 A1 | 12/2009 |
| JP | 638368 A | 2/1994 |
| JP | 2003299345 A | 10/2003 |
| JP | 2008263278 A | 10/2008 |
| WO | 2006013540 A2 | 2/2006 |

OTHER PUBLICATIONS

International Search Report (PCT/ISA/210) issued on Aug. 30, 2011 in the International Patent Application No. PCT/JP2011/067768.
Written Opinion (PCT/ISA/237) issued on Aug. 30, 2011 in the International Patent Application No. PCT/JP2011/067768.
Office Action dated Aug. 6, 2013, issued by the Japanese Patent Office in counterpart Japanese Application No. 2010-176268.
European Search Report dated Nov. 27, 2012 issued by the European Patent Office in counterpart European Application No. 11814669.5.
Communication dated Dec. 26, 2013, issued by the State Intellectual Property Office of the People's Republic of China in corresponding Application No. 201180003624.3.
Office Action dated Aug. 29, 2014, issued by the State Intellectual Property Office of the People's Republic of China in counterpart Chinese Application No. 201180003624.3.

* cited by examiner

RELATED ART

LOAD CONTROL APPARATUS

TECHNICAL FIELD

The present invention relates to a load control apparatus that controls a drive and a stop of a load by controlling a field effect transistor provided between a DC power supply and the load.

BACKGROUND ART

For example, a load control apparatus for controlling a load such as a lamp or a motor that is mounted in a vehicle is equipped with, for example, a field effect transistor (hereinafter referred to as "FET") between a battery (DC power supply) and the load, and controls a drive and a stop of the load by switching on and off the FET. Moreover, in order to interrupt the circuit in which the load is connected by quickly detecting an overcurrent when the overcurrent flows through the load, a protection circuit is equipped which switches off the FET when the voltage Vds between the drain and the source of the FET is detected to be increased.

FIG. 3 is a diagram which shows a load drive circuit in which a conventional load control apparatus is equipped. As shown in the figure, in the load drive circuit, an FET (T1: field effect transistor) is provided between a DC power supply VB (shown by the same reference sign VB as the output voltage) and a load RL (the load resistance which the load possesses, as well as the load, are assumed as RL collectively.), and the drive and the stop of the load RL are controlled by switching on and off the FET (T1).

The drain (drain electrode) of the FET (T1) is connected to the plus electrode of the DC power supply VB via a power supply line, and the source (source electrode) of the FET is connected to one end of the load RL via a load line, and the other end of the load RL is connected to the ground.

The power supply line is an electric wire extended from the plus electrode of the DC power supply VB to the drain of the FET (T1), and the load line is an electric wire extended from the source of the FET (T1) to the load RL.

The drain (point P1) of the FET (T1) is connected to the ground through a series circuit of resistances R1 and R2, and the point (P4, voltage V4) where the resistances R1 and R2 are connected is connected to the plus (non-inverting) input terminal of a comparator CMP1.

Further, the minus (inverting) input terminal of the comparator CMP1 is connected to the source (point P2, the voltage V2) of the FET (T1). Thus, when the FET (T1) is switched on and the load RL is driven, the output signal of the comparator CMP1 becomes a level L since the voltage V2 is higher than the voltage V4. Further, when an overcurrent flows to the FET (T1) and the voltage Vds between the drain and the source of the FET (T1) rises because, for example, the load line is grounded, the voltage V2 of the source decreases. Thus, the voltage V2 is lower than the voltage V4, and the output signal of the comparator CMP1 becomes a level H. The output signal is supplied to a driver 11 as an output signal Sout for determining an overcurrent.

The gate (gate electrode) of the FET (T1) is connected to the driver 11 through a gate resistance R3, and a charge pump 12 is connected to the driver 11. Furthermore, the driver 11 is connected to the DC power supply VB through a resistance R4 and is connected to the ground through an input switch SW1. Therefore, when the input switch SW1 is switched off (open circuit), a signal of the level H is input into the driver 11 and the FET (T1) is switched off, and on the other hand, when the input switch SW1 is switched on (closed circuit), a signal of the level L is input into the driver 11 and the FET (T1) is switched on. Further, the FET (T1) is switched off when a signal of the level H (an output signal Sout for determining an overcurrent) is supplied from the comparator CMP1.

Furthermore, between the gate and the source of the FET (T1), a Zener diode ZD1 is provided whose forward direction is a direction from the gate to the source. The voltage between the gate and the source is prevented by the Zener diode ZD1 from exceeding a predetermined voltage.

The power supply line (electric wire extended from the DC power supply VB to the drain of the FET (T1)) shown in FIG. 3 has an inductance component, and the inductance is assumed as Lw1. Similarly, the load line (electric wire extended from the source of the FET (T1) to the load RL) has an inductance component, and the inductance is assumed as Lw2. The resistances of the power supply line and the load line are ignored because they are extremely small.

Here, a capacitor C1 is disposed between the point P1 and the ground (minus electrode of the VB) to prevent the load control apparatus from malfunctioning due to electromagnetic noise that is generated from strong electric waves or various kinds of electrical components (for example, referring to Patent Literature 1).

CITATION LIST

Patent Literature

Patent Literature 1: JP6-38368A

SUMMARY OF INVENTION

Technical Problem

Next, operations of the load control apparatus configured as above are described. If the input switch SW1 is switched on, the driver 11 outputs the voltage from the charge pump 12. Because the voltage is applied to the gate of the FET (T1), the FET (T1) is switched on. In other words, the FET (T1) is switched on and off by switching on and off the input switch SW1, and thus the electric power supply from the DC power supply VB to the load RL is controlled.

In a transitional state in which the input switch SW1 is switched on, and FET (T1) is switched from off to on, a current I1 (as shown by the solid line of the figure) flows along the path from the plus electrode of VB→the power supply line (Lw1)→P1→T1→P2→the load line (Lw2)→P3→RL→the ground→the minus electrode of VB.

When the FET (T1) is switched on, the current I1 starts to increase from zero, and rises to a current value that is the voltage of the power supply VB divided by the resistance value of the load RL. In this process, back electromotive forces which are proportional to the gradient of the increase of the current I1 are generated in the inductances Lw1 and Lw2. Because the voltage V1 of the drain is pushed down by the back electromotive force generated in the inductance Lw1, the voltage V1 decreases. Therefore, the voltage of the capacitor C1 makes the capacitor C1 to be discharged.

The discharging current I2 (as shown by the broken line in the figure) of the capacitor C1 flows along the path from the plus terminal of C1→P1→T1→P2→the load line (Lw2)→P3→RL→the ground→the minus terminal of C1, and generates a back electromotive force in the inductance Lw2 of the load line. In this case, because the discharging current I2 of the capacitor C1 does not flow through the power supply line, a back electromotive force is not generated in the inductance Lw1 by the discharging current I2 of the capacitor C1.

When the discharging current I2 of the capacitor C1 increases, the voltage V2 of the point P2 is pushed up by the discharging current I2, but when the discharging current I2 stop increasing and turns to decrease, a back electromotive force that pushes down the voltage V2 is generated by the discharging current I2.

If there is not the capacitor C1 (i.e., if the back electromotive force is not generated due to the discharging current I2), the voltage V1 becomes lowest when it equals to the voltage V2, and then the voltage V1 is a voltage between the power supply voltage VB and the point P3 that is determined by the inductances Lw1 and Lw2. In other words, the minimum value of the voltage V1 is shown in the next formula (1) if there is not the capacitor C1.

$$\text{(The minimum voltage of } V1) = (VB - V3)Lw2/(Lw1 + Lw2) + V3 \quad (1)$$

When the inductance Lw2 is smaller than the inductance Lw1, or when the length of the load line is shorter than that of the power supply line, the minimum voltage of V1 of the formula (1) decreases.

In contrast, when there is the capacitor C1, because the discharging current I2 of the capacitor C1 continues even after the voltage V1 equals to the voltage V2, the decrease of the voltage V1 continues, and the minimum voltage of the voltage V1 becomes further lower than the voltage shown in the formula (1). If the drop quantity of the voltage V1 increases, the following problems occur.

In other words, because the input terminal voltage of the comparator CMP1 depends on the magnitude of the voltage V1, when the voltage V1 decreases, the input terminal voltage of the comparator CMP1 decreases correspondingly. The low limit of the in-phase input range of the input terminal voltage of the comparator CMP1 is about 2V, and the comparator CMP1 does not function when the input voltage becomes lower than this low limit. In this case, the output of the comparator CMP1 becomes unstable, and there may be abnormal conditions in which an output indicating an over-current condition is output due to unstableness of the comparator CMP1 even if there are not any over-current conditions. As a result, there may be a phenomenon that the FET (T1) is shut off mistakenly when there is not an overcurrent.

Below, simulation results on the specific change of the electric voltages and currents are described with reference to characteristic diagrams shown in FIGS. 4, 5(a) and 5(b). FIG. 4 is a characteristic diagram that shows the change of respective voltage and current waveforms when the capacitor C1 for noise measures is not provided by the circuit shown in FIG. 3. Here, each of the circuit constants shown in FIG. 3 is set as follows. In other words, it is assumed that the voltage of the power supply VB=12V, Lw1=2.5 µH (equivalent to a power supply line of 2.5 m), the on-resistance (saturated value) of the FET (T1)=3.5 mΩ, Lw2=2 µH (equivalent to a load line of 2 m), the load resistance RL=2Ω, the voltage of the charge pump=VB+15V, the gate resistance R3=1.5 kΩ, and C1=0.1 µF.

In FIG. 4, the horizontal axis (X-axis) shows a time axis, and the three vertical axes (Y1, Y2, Y3) show voltage coordinates and two kinds of current coordinates. The vertical axis Y1 corresponds to voltage coordinates, and shows the coordinates of V1, the gate voltage VG of the FET (T1), V2, V3 and VB. The vertical axis Y2 corresponds to current coordinates, and shows the coordinates of the power supply line current I1 and the drain current ID of the FET (T1) which are large currents. The vertical axis Y3 shows coordinates of the gate current IG of the FET (T1) which is a small current. Further, a plus voltage is shown upwards in the vertical axis Y1, a plus current is shown downwards in the vertical axis Y2, and a plus current is shown upwards in the vertical axis Y3.

When the input switch SW1 is switched on at the time of 2.200 [msec] of the horizontal axis, the gate voltage VG of the FET (T1) rises, and gate electric the current IG increases rapidly. The voltage V1 begins to decrease from the time of 2.2009 [msec] and the voltage V2 begins to rise. The power supply line current I1 and the drain current ID of the FET (T1) begin to flow at the same time. The drain current ID equals to the power supply line current I1. The voltage V2 equals to the voltage V1 at the time of 2.2015 [msec], and the voltage V1 becomes a minimum value (6.47V). Then, the voltages V1 and V2 rise all together. In the following, the point in the waveforms of the voltage V1 and the voltage V2 where the voltage V1 equals to the voltage V2 is called a "point A".

Further, the magnitude of the voltage V3 increases proportionally to the drain current ID because the voltage V3 is a voltage drop that is generated as the drain current ID of the FET (T1) flows through the load RL. The waveforms of the voltage V1 and the voltage V2 after the point A corresponds to a voltage in which a difference voltage between the voltage of the power supply VB and the voltage V3 is divided by the inductances Lw1 and Lw2. And it is found that right after the voltage V1 begins to drop, the reduction of the difference between the voltage V1 and the voltage V2 is a main factor to make the voltage V1 to drop, and the increase of the voltage V3 is a main factor to push up the voltage V1. Further, the point A becomes the minimum value of the voltage V1 because the factor to make the voltage V1 to drop becomes extinct when the voltage V1 and the voltage V2 reaches the point A.

It can be seen from the above that, when the capacitor C1 for noise measures is not provided, because the voltage V1 becomes a minimum value at the point A and rises after that, the voltage V1 would not decrease below the low limit of the in-phase input voltage of the comparator CMP1, and the phenomenon that the comparator CMP1 malfunctions will not happen.

Next, simulation results on the change of the specific electric voltages and currents in the circuit (circuit in which the capacitor C1 is provided) shown in FIG. 3 are described with reference to FIGS. 5(a) and 5(b). FIG. 5(a) is a characteristic diagram that shows the change of respective voltage waveforms of the circuit shown in FIG. 3, and FIG. 5(b) is a characteristic diagram that shows the change of respective current waveforms of the circuit shown in FIG. 3.

In FIG. 5(b), a vertical axis Y1 corresponds to current coordinates, and shows coordinates of the power supply line current I1, the discharging current I2 of the capacitor C1 and the drain current ID of the FET (T1) which are large currents. A vertical axis Y2 shows coordinates of the gate current IG of the FET (T1) which is a small current. Further, a plus current is shown downwards in the vertical axis Y1, and a plus current is shown upwards in the vertical axis Y2.

Thus, in the characteristic diagram shown in FIGS. 5(a) and 5(b), since the capacitor C1 is provided, the discharging current I2 that flows through the capacitor C1, the power supply line current I1 and drain current ID of the FET (T1) are different from those in FIG. 4 which is the characteristic diagram in which the capacitor C1 is not provided (referring to FIG. 5(b)). This is due to the following: the discharging current of the capacitor C1 flows through the load line (Lw2), but does not flow through the power supply line (Lw1), the charging current of the capacitor C1 flows through the power supply line, but does not flow through the load line, and the discharging current and the charging current of the capacitor C1 do not flow at the same time.

In other words, this is due to the following: at the time of the discharging of the capacitor C1, a current flows along the path of the discharging current I2 (as shown with the wavy line) of FIG. 3 and at the time of the charging of the capacitor C1, a current flows along the path of plus electrode of VB→Lw1→C1→GND the minus electrode of VB.

When the increase gradient of the drain current ID of the FET (T1) is large, the increase gradient of the power supply line current becomes small, and on the contrary, when the increase gradient of the power supply line current increases, the increase gradient of the drain current ID becomes small.

Therefore, the voltage V1 oscillates since there is the capacitor C1 (referring to FIG. 5(a)). This is caused by the fact that a natural vibration of the current occurs due to the capacitance (electrostatic capacity) of the capacitor C1 and the inductance of the path along which the charging and discharging currents of the capacitor C1 flow. The cycle is approximately 3 (μsec) in the example shown in FIGS. 5(a) and 5(b). The minimum value of the voltage V1 becomes lower than the initial voltage V1 after the FET (T1) is switched on (referring to FIG. 5(a))). This is because that, after the FET (T1) is switched on, the drop quantity of the voltage V1 is limited by the increase of the voltage V3 as time passes.

The change of respective voltages and currents is described in detail as follows. As shown in FIGS. 5(a) and 5(b), when the input switch SW1 is switched on and the FET (T1) is switched on at the time of 2.200 [msec], the voltage V1 decreases due to the back electromotive force, and the capacitor C1 which is charged to the voltage is discharged. The discharging current I2 is limited by the voltage Vds between the drain and the source of the FET (T1). As the voltage Vds between the drain and the source decreases, the limitation becomes weaker, and thus the discharging current increases. When the point A where the voltage V2 equals to the voltage V1 is arrived as the voltage Vds between the drain and the source reduces, the discharging current I2 stops increasing because the limitation does not become weaker any more, and then the discharging current I2 turns to decrease. In other words, the peak (the peak of the amplitude downwards in FIG. 5(b)) of the discharging current I2 (refer to FIG. 5(b)) almost corresponds to the point where the voltage V1 equals to the voltage V2 (the point A).

In the example shown in FIG. 4 (that is, when the capacitor C1 is not equipped), the voltage V1 stops decreasing and turns to increase after the point A, but in the example of FIGS. 5(a) and 5(b), the voltage V1 will not turn to increasing but further decreases. When the discharging current I2 of the capacitor C1 becomes approximately 0 (A), the voltage V1 becomes the minimum value.

It is found that the minimum value of the voltage V1 is 3.48V, which is 2.99V lower than 6.47V provided when the capacitor C1 is not equipped.

Here, the reason that the voltage V1 further decreases after the point A is as follows. Although the discharging current I2 of the capacitor C1 which increases until the point A turns to decrease after the point A, in order that the discharging current I2 returns to zero, the decreasing period of the discharging current has to be the same as the increasing period of the discharging current I2 because the current vibration of the capacitor C1 is made by exchanging energy with the inductance components of the path along which the charging and discharging current of the capacitor C1 flows and the law of the conservation of energy is followed at this time. In this period, the voltage V1 must decrease in order that the capacitor C1 is discharged. This is the reason that the voltage V1 continues decreasing even after the point A.

Thus, it can be confirmed from the simulation results that the drop quantity of the voltage V1 increases since the capacitor C1 for noise measures is provided.

As mentioned above, the influence of strong electric waves and electromagnetic noise can be prevented by providing the conventional load control apparatus with the capacitor C1 for noise measures. But on the other hand, the drop quantity of the voltage V1 increases when the FET (T1) is switched on, and a phenomenon that the comparator CMP1 malfunctions occurs. Thus there is an increasing demand to somehow balance these requirements.

The present invention is accomplished to solve such a conventional problem and the purpose of the invention is to provide a load control apparatus in which a circuit of detecting an overcurrent can be normally operated even if the first capacitor for noise measures is disposed.

Solution to Problem

In order to achieve the object, a first aspect of the invention describes a load control apparatus that controls a drive and a stop of a load by switching on and off a field effect transistor which is provided between a DC power supply and the load, wherein a drain electrode of the field effect transistor is connected to a plus electrode of the DC power supply via a power supply line, and a source electrode of the field effect transistor is connected to one end of the load via a load line, and the other end of the load is connected to a minus electrode of the DC power supply, the load control apparatus including: a comparing unit that is configured to detect an overcurrent by comparing a reference voltage based on a drain voltage of the field effect transistor and a source voltage of the field effect transistor; a control unit that is configured to output a drive signal to the gate electrode of the electric field transistor when the load is to be driven, and also to stop output of the drive signal when the overcurrent is detected by the comparing unit; a first capacitor that is provided between the drain electrode of the field effect transistor and the minus electrode of the DC power supply; and a second capacitor that is provided between the gate electrode and the drain electrode of the field effect transistor.

A second aspect of the invention describes that the load control apparatus includes a diode that is provided between the gate electrode and the second capacitor, a forward direction of the diode being a direction from the gate electrode to the second capacitor; and a Zener diode that is provided between the source electrode and the second capacitor, a forward direction of the Zener diode being a direction from the source electrode to the second capacitor.

Advantageous Effects of Invention

Because the second capacitor is provided between the gate electrode and the drain electrode of the field effect transistor in the load control apparatus according to the present invention, the change of the drain voltage of the field effect transistor can be expressed and the comparing unit that operates based on the drain voltage can be prevented from malfunctioning.

Further, because the diode is provided between the gate electrode and the second capacitor, the gate voltage of the field effect transistor can be held at the ground level, and the field effect transistor can be prevented from generating heat even if the voltage of the gate voltage of the field effect transistor rises to the voltage of the minus terminal of the second capacitor.

DESCRIPTION OF EMBODIMENTS

Figure 1:
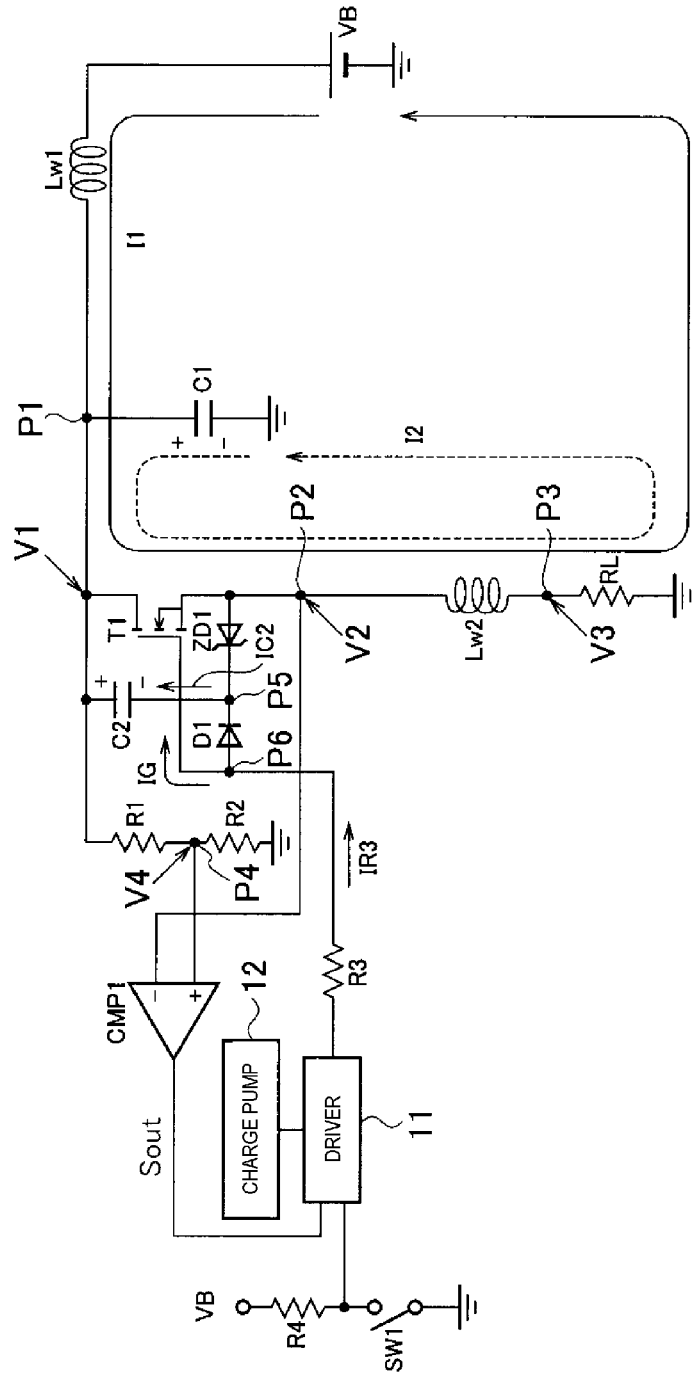
FIG. 1 is a circuit diagram that shows a configuration of a load control apparatus according to one embodiment of the present invention.

Next, an embodiment of the present invention is described based on the figures. FIG. 1 is a diagram which shows a load drive circuit in which a load control apparatus is mounted according to one embodiment of the present invention. As shown in the figure, the load drive circuit is provided with a FET (T1: field effect transistor) between a DC power supply VB (shown by the same reference sign VB as the output voltage) and a load RL, and controls a drive and a stop of the load RL by switching on and off the FET (T1).

The drain (drain electrode) of the FET (T1) is connected to the plus electrode of the DC power supply VB via a power supply line, and the source (source electrode) of the FET is connected to one end of the load RL via a load line, and the other end of the load RL is connected to the ground.

The power supply line is an electric wire extended from the plus electrode of the DC power supply VB to the drain of the FET (T1), and the load line is an electric wire extended from the source of the FET (T1) to the load RL. The power supply line has an inductance component which is shown as Lw1.

The load line also has an inductance component which is shown as Lw2. The resistance components of the power supply line and the load line are ignored because they are extremely small.

The drain (voltage V1) of the FET (T1) is connected to the ground through a series circuit of resistances R1 and R2, and the point P4 where the resistances R1 and R2 are connected is connected to the plus input terminal of a comparator CMP1. Further, the minus input terminal of the comparator CMP1 is connected to the source (point P2) of the FET (T1). Thus, when the FET (T1) is switched on and the load RL is driven, the output signal of the comparator CMP1 becomes a level L since the voltage V2 of the point P2 is higher than the voltage V4 of the point P4. Further, when an overcurrent flows to the FET (T1) and the voltage Vds between the drain and the source of the FET (T1) rises because, for example, the load line is grounded, the voltage V2 of the source decreases and is lower than the voltage V4, and the output signal of the comparator CMP1 becomes a level H. The output signal is supplied to a driver 11 as an output signal Sout for determining an overcurrent.

The gate (gate electrode) of the FET (T1) is connected to the driver 11 through a gate resistance R3, and a charge pump 12 is connected to the driver 11. Furthermore, the driver 11 is connected to the DC power supply VB through a resistance R4 and is connected to the ground through an input switch SW1. Therefore, when the input switch SW1 is switched off (open circuit), a signal of the level H is input into the driver 11 and the FET (T1) is switched off, and on the other hand, when the input switch SW1 is switched on (closed circuit), a signal of the level L is input into the driver 11 and the FET (T1) is switched on. Further, the FET (T1) is switched off when a signal of the level H (an output signal Sout for determining an overcurrent) is supplied from the comparator CMP1.

Furthermore, the anode of a diode D1 is connected to the gate (a point P6) of the FET (T1), and a point P5 which is the cathode of the diode D1 is connected to the cathode of the Zener diode ZD1, and the anode of the Zener diode ZD1 is connected to the point P2. Further, the point P5 is connected to the drain of the FET (T1) through a capacitor C2 (the second capacitor).

Further, between the point P1 and the ground (the minus electrode of VB), a capacitor C1 (the first capacitor) is disposed to prevent from malfunctioning due to electromagnetic noise that is caused by strong electric waves and various kinds of electrical components.

Figure 3:
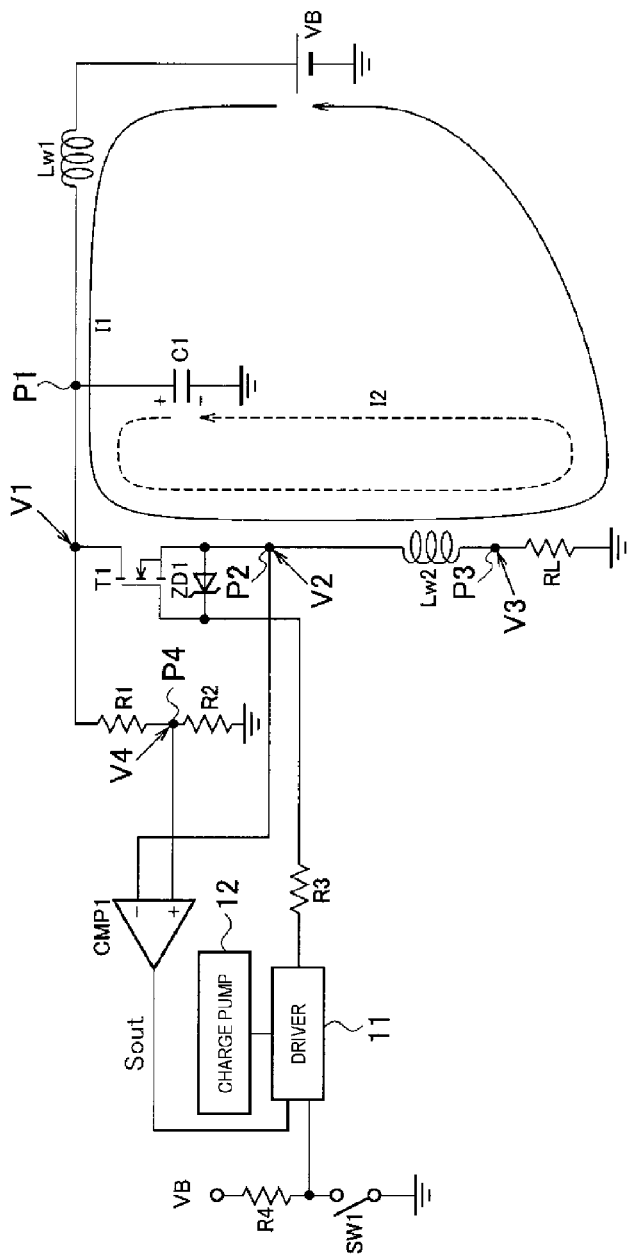
FIG. 3 is a circuit diagram that shows a configuration of a conventional load control apparatus.

In other words, the load control circuit according to the present embodiment differs from the circuit of FIG. 3 shown in the conventional embodiment in that the diode D1 is disposed in series with the Zener diode ZD1 that clamps the voltage between the gate and the source of the FET (T1) below a predetermined value, and that the capacitor C2 is disposed between the point P5 and the drain of the FET (T1).

Next, operations of the load control apparatus according to the present embodiment are described. In the circuit shown in FIG. 1, when the input switch SW1 is switched on, the voltage of the charge pump 12 is output from the driver 11, and the voltage (a drive signal) is applied to the gate of the FET (T1). In other words, the driver 11 applies a current into the gate of the FET (T1) through the gate resistance R3.

When the current is applied into the gate of the FET (T1), the voltage Vds between the drain and the source of the FET (T1) decreases, and a drain current ID flows through the FET (T1). In other words, a power supply line current I1 shown in FIG. 1 begins to flow, and the current I1 becomes the drain current ID. When the power supply line current I1 flows, a back electromotive force is generated in each of the inductance Lw1 of the power supply line and inductance Lw2 of the load line, and the voltage V1 of the drain decreases. Because the charged voltage of the capacitor C1 is higher than the voltage V1 when the voltage V1 decreases, the charged capacitor C1 starts discharging and a discharging current I2 superimposes on the power supply line current I1 and flows through the FET (T1), the inductance Lw2 of the load line and the load RL.

Here, as previously described, the voltage V1 decreases as the voltage Vds between the drain and the source is reduced until the voltage V2 equals to the voltage V1 (until the previously described point A is reached). A part of the current that flows through the gate resistance R3 flows along the path of R3→P6→D1→P5→C2 the drain of T1→the source of T1 when the voltage V1 decreases as the voltage Vds between the drain and the source is reduced.

If the current that flows through the capacitor C2 is assumed as IC2, the current that is applied into the gate of the FET (T1) is IG, and the current that flows through the gate resistance R3 is IR3, the next formula (2) is established.

$$IG = IR3 - IC2 \quad (2)$$

In other words, because a part of the output current IR3 output from the driver 11 bypasses the gate of the FET (T1) and flows through the capacitor C2 (the current IC2), the gate current IG that is applied into the gate of the FET (T1) is reduced by the corresponding amount.

The magnitude of the bypassing current IC2 depends on the reducing speed of the voltage Vds between the drain and the source, and current IC2 increases if the reducing speed of the voltage Vds between the drain and the source increases. As the current IC2 increases, the gate current IG decreases. Thus, the increase of the amount of charge accumulated to the gate of the FET (T1) slows down, and the reducing speed of the voltage Vds between the drain and the source decreases. In contrast, when the reducing speed of the voltage Vds between the drain and the source decreases, the current IC2 decreases, and the gate current IG increases. Thus, the increase of the amount of charge accumulated to the gate of the FET (T1) speeds up, and the reducing speed of the voltage Vds between the drain and the source increases.

In other words, the change of the voltage Vds between the drain and the source which is the voltage between V1 and V2 is suppressed by the flowing of the current IC2 and will become close to a monotonical decrease.

Figure 5:
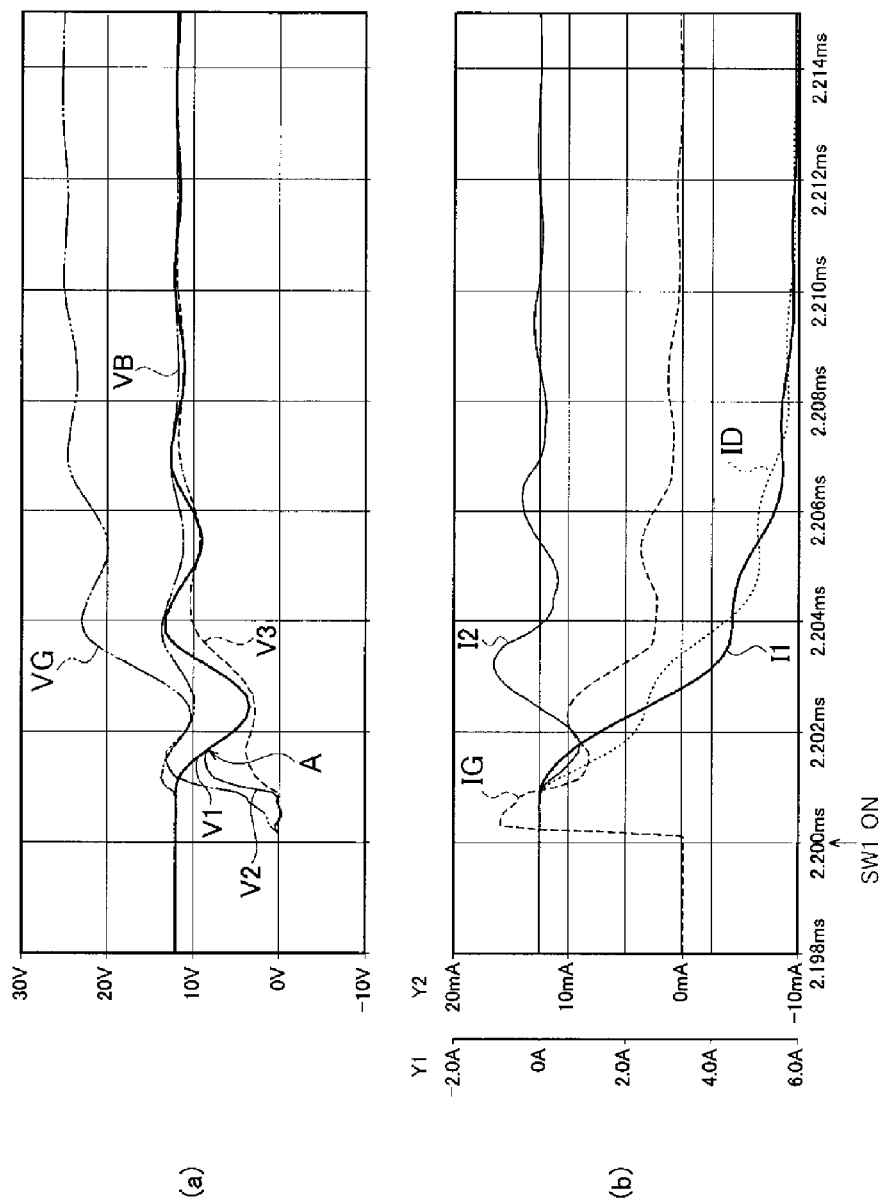
In FIGS. 5,(a) and (b) are characteristics diagrams that show the change of respective voltages and currents of the conventional load control apparatus in which the capacitor C1 is provided.

Therefore, the change of the voltage V1 due to the increase and decrease of the discharging current I2 of the capacitor C1 can be suppressed even if the accumulated voltage of the capacitor C1 makes the capacitor C1 to be discharged as the voltage V1 decreases. In other words, it can be suppressed that the voltage V1 oscillates up and down as shown in FIG. 5(a).

This is because the increase and decrease of the discharging current of the capacitor C1 depends on the reducing speed of the voltage Vds between the drain and the source until the voltage V1 equals to the voltage V2 (until reaching the point A). Further, since the gate current IG decreases due to the flowing of the current IC2, and the accumulation of the gate electric charge becomes slow, the time required to reach the point A gets longer than that when there is not the capacitor C2. Therefore, the natural oscillation due to the charging and discharging currents of the capacitor C1 until reaching the point A is suppressed and attenuated. Meanwhile, because the drain current ID of the FET (T1) increases and the voltage drop V3 in the load resistance increases, the drop quantity of V1 is limited and the voltage V1 is lifted by the voltage V3 and rises after the point A. Thus, the drop quantity of the voltage V1 can be suppressed.

Figure 2:
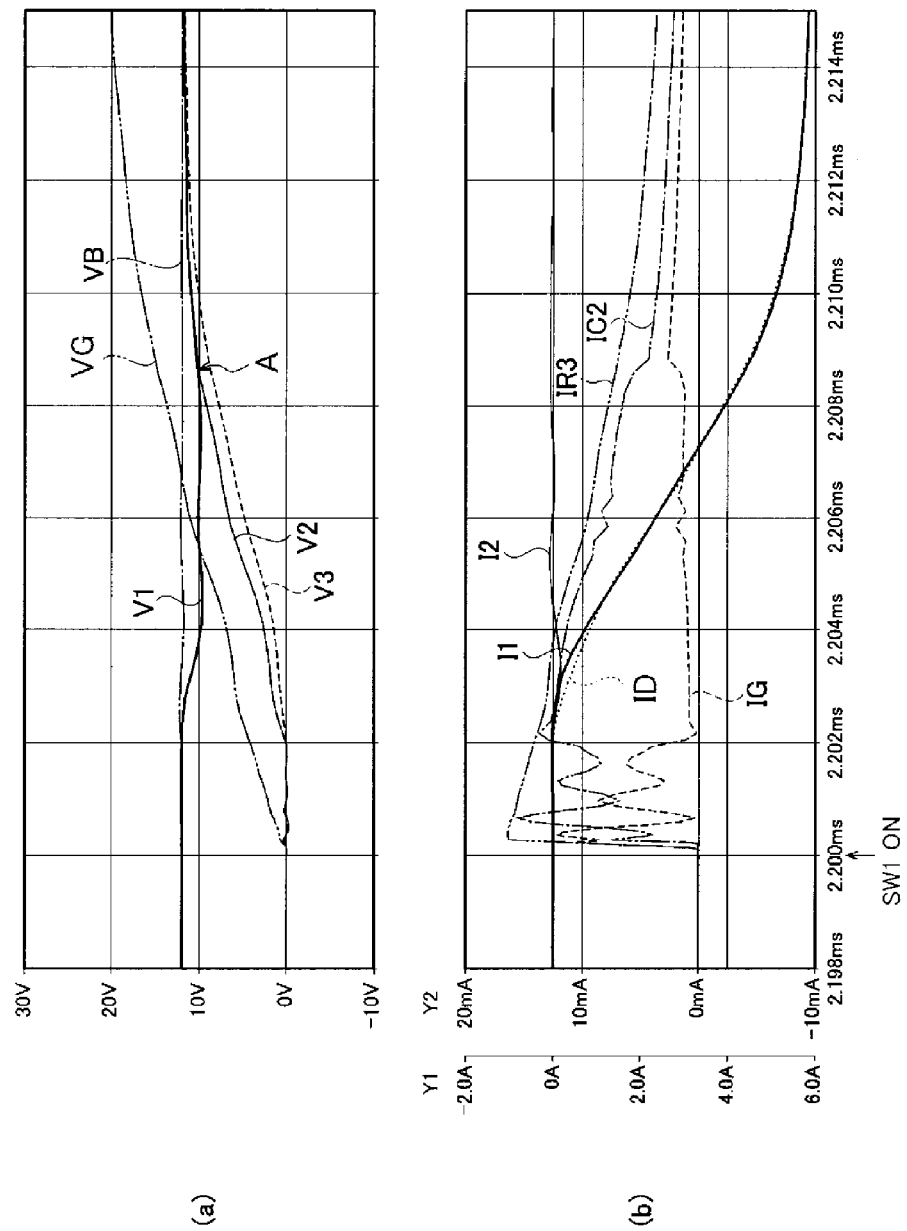
In FIGS. 2,(a) and (b) are characteristics diagrams that show the change of respective voltages and currents of the load control apparatus according to the embodiment of the present invention.

Next, simulation results on the specific change of the electric voltages and currents are described with reference to characteristic diagrams shown in FIGS. 2(a) and 2(b). In FIGS. 2,(a) and (b) are characteristics diagrams that show the change of respective voltages and currents of the circuit shown in FIG. 1. Further, circuit constants shown in FIG. 1 are set as follows. In other words, it is assumed that the voltage of the power supply VB=12V, Lw1=2.5 μH (equivalent to a power supply line of 2.5 m), the on resistance (saturated value) of the (T1)=3.5 m Ω, Lw2=2 μH (equivalent to a load line of 2 m), the load resistance RL=2Ω, the voltage of the charge pump=VB+15V, the gate resistance R3=1.5 kΩ, C1=0.1 μF, and C2=5 nF.

In FIG. 2(a) and FIG. 2(b), a horizontal axis (X-axis) shows a time axis. Further, the vertical axis in FIG. 2(a) corresponds to voltage coordinates, and a plus voltage is shown upwards. Two kinds of current coordinates are shown with two vertical axes (Y1, Y2) in FIG. 2(b). The vertical axis Y1 corresponds to current coordinates, and shows coordinates of the power supply line current I1 and the drain current ID of T1 which are large currents. The vertical axis Y2 shows coordinates of the gate current IG of T1 which is a small current. Further, a plus current is shown downwards in the vertical axis Y1, and a plus current is shown upwards in the vertical axis Y2.

In FIGS. 2(a) and 2(b), when the input switch SW1 is switched on at the time of 2.200 [msec], the output current IR3 of the driver 11 rises rapidly, and then monotonically decreases. In this case, the gate current IG and the current IC2 flow while maintaining the relation of IR3=IG+IC2. In FIG. 2(b), the coordinates indicating the magnitudes of the gate current IG and the current IC2 correspond to Y2.

The drain current ID of the FET (T1) begins to flow when the voltage Vds between the drain and the source (between V1 and V2) begins to decrease. At the same time, the current IC2 increases and the gate current IG is suppressed. Since the gate current IG is suppressed, the accumulating speed of the gate electric charge of the FET (T1) becomes lower, and the time required to reach the point A where the voltage V1 equals to the voltage V2 becomes longer (later than that for the point A described in FIG. 5(a)). Meanwhile, the current IC2 decreases while the change of the voltage Vds between the drain and the source is suppressed. Then, when reaching the point A, the current IC2 and the gate current IG suddenly come close, and then the currents IC2 and IG monotonically decreases together.

On the other hand, since the time when reaching the point A has been delayed, the voltage V3 increases sufficiently and the voltage V1 is pushed up after the point A. Further, the reduction of the voltage Vds between the drain and the source is suppressed by the current IC2 and the voltage Vds nearly monotonically decreases. Thus, the discharging current I2 of the capacitor C1 decreases and its change becomes slower. It is found that the peak value of the discharging current I2 becomes 175.5 mA, which is much smaller than the peak value of 943 mA when there is not the capacitor C2 (the example shown in FIGS. 5(a) and 5(b)). Since the discharging current and the charging current of the capacitor C1 become smaller and their changes becomes slower, the decrease of the voltage V1 is suppressed, and the change of the voltage V1 becomes slower.

Figure 4:
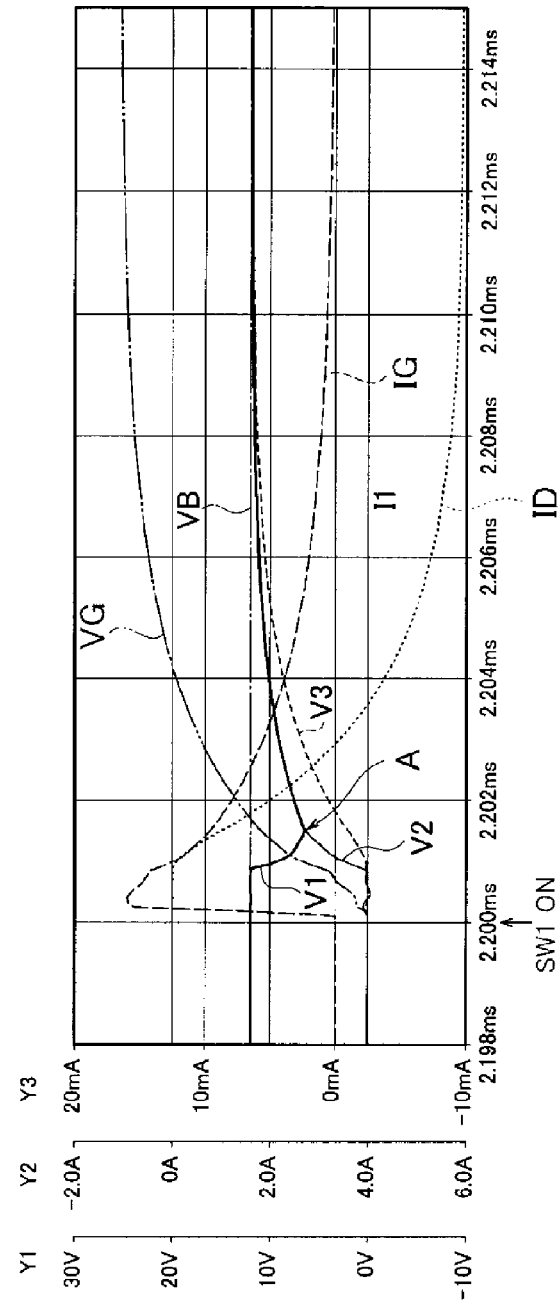
FIG. 4 is a diagram of the characteristics that show the change of the respective voltages and currents of the conventional load control apparatus in which the capacitor C1 is not provided.

As a result, the minimum value of the voltage V1 becomes 9.624V which is much larger than 3.48V shown in FIG. 5(a). Furthermore, it is found that it is even larger than 6.45V provided when the capacitor C1 is not provided (the example shown in FIG. 4).

Next, the reason that the diode D1 shown in FIG. 1 is provided is described. In the circuit shown in FIG. 1, when the FET (T1) is in an off state; the source of the FET (T1) is grounded via the resistance of the load RL, and becomes a ground level. Because the minus terminal of the capacitor C2 becomes the ground level due to the leak current from the cathode of the Zener diode ZD1 to the anode, the voltage between the terminals of the capacitor C2 becomes equal to the voltage V1.

Here, when the voltage V1 of the point P1 drops for some reasons and falls from the present voltage V1 to a voltage V1x, the voltage of the capacitor C2 makes the capacitor C2 to be discharged along the path of the plus terminal of C2→P1→the disturbance (V1x)→the ground→RL→the load line (Lw2)→P2→ZD1→the minus terminal of C2, and the voltage between the terminals of the capacitor C2 becomes "V1x+VfZD". However, VfZD is the forwards voltage of the Zener diode ZD1. After that, when the voltage of the point P1 returns to the initial voltage V1 at a steep gradient, because the capacitor C2 is maintained in a state of discharging, the voltage of the minus terminal of the capacitor C2 rises with respect to the ground level and the voltage at this time is shown in the next formula (3).

The voltage of the minus terminal of $C2 = V1 - (V1x + VfZD) = V1 - V1x - VfZD$  (3)

From the formula (3), when the voltage V1x decreases as the drop of the voltage of the point P1 increases, the rise of the minus terminal voltage of the capacitor C2 increases.

At this time, when the diode D1 is not provided, the gate voltage VG of the FET (T1) equals to the voltage shown in the formula (3). The FET (T1) is switched on when the voltage shown in the formula (3) is higher than the threshold voltage of the FET (T1). At this time, since the FET (T1) works as a source follower which assumes the voltage shown in the formula (3) as the gate voltage VG, a drain current ID flow, and the source voltage rises.

Although the drain current ID is smaller than that when the FET (T1) is completely switched on, because the voltage between the drain and the source is high, the power consumption of the FET (T1) increases, and the FET (T1) generates heat. The voltage shown in the formula (3) decreases exponentially, and the time constant at this time in the circuit shown in FIG. 1 becomes the next formula (4).

$$C2*R3 = 5*10^{-9}*1.5*10^{3} = 7.5 \, \mu sec \quad (4)$$

The time constant obtained from the formula (4) shows a case in which the gate grounding resistance is 1.5 kΩ when the FET (T1) is switched off, but if the gate grounding resistance becomes bigger than this, the period in which the gate of the FET (T1) rises gets longer.

In contrast, when the diode D1 shown in FIG. 1 is provided, the gate voltage VG of the FET (T1) becomes around the ground level. The FET (T1) would not be switched on even if the rise of the minus terminal of the capacitor C2 occurs. This is the purpose of providing the diode D1.

Here, the reason to make the voltage V1 fall corresponds to the following case. In the conventional circuit shown in FIG. 3, the load drive circuit arranged between the point P1 and the ground is shown as 1 channel, but it is not unusual that a plurality of load drive circuits (channels) are arranged in parallel between the point P1 and the ground. In the circuit of such configuration, when any one of the load lines is short-circuited among the plurality of load drive circuits, and an overcurrent flows, the voltage V1 of the point P1 which is common to each of the load drive circuits suddenly decreases.

Thus, in the load drive circuit in which a short circuit occurs, an overcurrent protection circuit is activated, and the overcurrent is cut off. As a result, when the voltage V1 of the point P1 rises and is higher than the stabilized voltage of the point P1, the voltage overshoots and converges to the stabilized voltage. This voltage change is the reason that the V1 drop in those circuits in which a short circuit grounding does not occur among the plurality of load drive circuits (channels). Therefore, it can be said that the diode D1 is particularly effective in circuits where a plurality of load drive circuits (channels) are provided.

In this way, in the load control apparatus according to the present embodiment, because the capacitor C2 is provided between the gate and the drain of the FET (T1), a part of the output current IR3 bypasses the gate and flows through the capacitor C2, and the gate current IG of the FET (T1) decreases when the output current IR3 is output from the driver 11. Therefore, time required until the voltage V1 equals to the voltage V2 can be delayed and the drop quantity of the voltage V1 can be suppressed. Therefore, the conventional problem that the voltage V1 suddenly decreases and comparator CMP1 does not operate can be solved.

Further, the problem that the FET (T1) is switched on and generates heat due to disturbance can be avoided by providing the diode D1.

Although the load control apparatus of the present invention has been described above based on the embodiment shown in the figures, the present invention should not be limited to this. Instead, the constitution of respective parts can be replaced with any constitution having similar functions.

For example, although in the above described embodiment, a load control apparatus equipped in a load drive circuit that drives a load carried by a vehicle is used as an example and described, the present invention should not be limited to this, but can be applied to other load drive circuits.

Although the present invention is described in detail with reference to specific embodiments, it is apparent that various modifications and modifications may be made by those skilled in the art without departing from the spirit and scope of the invention.

This application is based on the Japanese patent application (No. 2010-176268) filed on Aug. 5th, 2010, the contents of which are incorporated herein by reference.

INDUSTRIAL APPLICABILITY

The present invention is useful in preventing a sudden drop of the drain voltage of a field effect transistor even when a capacitor for noise measures is provided in a load drive circuit.

REFERENCE SIGNS LIST

11: driver
12: charge pump
VB: DC power supply
T1: field effect transistor (FET)
RL: load
CMP1: comparator (comparing means)
C1: first capacitor
C2: second capacitor
D1: diode
Lw1: inductance of the power supply line
Lw2: inductance of the load line

The invention claimed is:

1. A load control apparatus that controls a drive and a stop of a load by switching on and off a field effect transistor which is provided between a DC power supply and the load, wherein
  a drain electrode of the field effect transistor is connected to a plus electrode of the DC power supply via a power supply line, and a source electrode of the field effect transistor is connected to one end of the load via a load line, and the other end of the load is connected to a minus electrode of the DC power supply,
  the load control apparatus comprising:
  a comparing unit that is configured to detect an overcurrent by comparing a reference voltage based on a drain voltage of the field effect transistor and a source voltage of the field effect transistor;
  a control unit that is configured to output a drive signal to a gate electrode of the field effect transistor when the load is to be driven, and also to stop output of the drive signal when the overcurrent is detected by the comparing unit;
  a first capacitor that is provided between the drain electrode of the field effect transistor and the minus electrode of the DC power supply; and
  a second capacitor that is provided between the gate electrode and the drain electrode of the field effect transistor.

2. The load control apparatus according to claim 1, comprising:
  a diode that is provided between the gate electrode and the second capacitor, a forward direction of the diode being a direction from the gate electrode to the second capacitor; and a Zener diode that is provided between the source electrode and the second capacitor, a forward direction of the Zener diode being a direction from the source electrode to the second capacitor.

3. The load control apparatus according to claim 2, wherein the diode is capable of conduction only in the forward direction.

4. The load control apparatus according to claim 2, wherein a cathode of the diode, a cathode of the Zener diode and a negative terminal of the second capacitor are connected at a same node.

5. The load control apparatus according to claim 1, wherein a positive terminal of the first capacitor and a positive terminal of the second capacitor are connected at a same node as the drain electrode of the field effect transistor.

* * * * *